United States Patent
Takeda et al.

[11] Patent Number: 6,059,878
[45] Date of Patent: May 9, 2000

[54] METHOD OF MANUFACTURING A BISMUTH-SUBSTITUTED RARE-EARTH IRON GARNET SINGLE CRYSTAL FILM

[75] Inventors: Norio Takeda; Kiyonari Hiramatsu; Kenji Ishikura, all of Tokyo, Japan

[73] Assignee: Mitsubishi Gas Chemical Company, Inc., Tokyo, Japan

[21] Appl. No.: 09/264,235

[22] Filed: Mar. 8, 1999

[30] Foreign Application Priority Data

Mar. 12, 1998 [JP] Japan ................................ 10-061311

[51] Int. Cl.[7] .................................................. C30B 19/02
[52] U.S. Cl. .................. 117/56; 117/54; 117/55; 252/62.56; 252/62.57; 252/62.63
[58] Field of Search .................. 117/54, 55, 56; 252/62.56, 62.57, 62.63

[56] References Cited

U.S. PATENT DOCUMENTS

| | | | |
|---|---|---|---|
| 5,535,046 | 7/1996 | Shirai et al. | 359/281 |
| 5,565,131 | 10/1996 | Shirai et al. | 252/62.56 |
| 5,683,506 | 11/1997 | Shirai et al. | 117/54 |
| 5,965,287 | 10/1999 | Suzuki et al. | 428/694 ML |

*Primary Examiner*—Felisa Hiteshew
*Attorney, Agent, or Firm*—Sughrue, Mion, Zinn, Macpeak & Seas, PLLC

[57] ABSTRACT

A method is used when manufacturing a bismuth-substituted rare-earth iron garnet single crystal (BIG) film by the LPE method. The BIG film is grown on one side of a non-magnetic garnet substrate using a melt that contains flux components and rare-earth oxides. An amount of calcium is added to the melt such that a difference between optical absorption coefficients of the film at a wavelength of 0.78 $\mu$m before and after subjecting the film to hydrogen-reduction treatment ranges from 660 to 1430 dB/cm. The film is grown on a non-magnetic garnet substrate having a thickness in the range of 400–600 $\mu$m, at a crystal growth temperature of the melt to form a film-substrate structure. The film-substrate structure has a curvature ranging from +0.3 to +0.7 $m^{-1}$ at room temperature. The film-substrate structure is subjected to the hydrogen reduction at a temperature ranging from 320 to 400° C. in a hydrogen atmosphere, so that the curvature of the film-substrate structure decreases to a value ranging from −0.1 to +0.1 $m^{-1}$.

4 Claims, 2 Drawing Sheets

POSITIVE CURVATURE

NEGATIVE CURVATURE

METHOD OF MANUFACTURING A BISMUTH-SUBSTITUTED RARE-EARTH IRON GARNET SINGLE CRYSTAL FILM

BACKGROUND OF THE INVENTION

1. Field of the Invention

The present invention relates to a bismuth-substituted rare-earth iron garnet single crystal which is used as a Faraday rotator applied to magneto-optic sensors and optical isolators, and more particularly to a method of manufacturing a bismuth-substituted rare-earth iron garnet single crystal film in the form of a flat film formed on a non-magnetic garnet substrate.

2. Description of the Related Art

In recent years, optical fiber communications and optical instrumentation have made remarkable progress. Semiconductor lasers are widely used as a signal source in the optical fiber communications and optical instrumentation. However, semiconductor lasers are disadvantageous in that the oscillation becomes unstable due to so-called reflected light return. In other words, the light is reflected by, for example, the end surface of the optical fiber back to the semiconductor laser. In order to solve this drawback, an optical isolator is usually provided on the light-exiting side of the semiconductor laser. The optical isolator blocks the reflected light return, thereby stabilizing the oscillation of the semiconductor laser.

An optical isolator includes a polarizer, analyzer, Faraday rotator, and permanent magnet. The permanent magnet causes the Faraday rotator to magnetically saturate. The Faraday rotator plays a major role in the optical isolator and is usually formed of a bismuth-substituted rare-earth iron garnet single crystal (referred to as BIG hereinafter) having a thickness in the range from several tens to 550 $\mu$m, grown by the liquid phase epitaxial method (referred to as LPE method hereinafter). Proposed single crystals are, for example, $(HoTbBi)_3Fe_5O_{12}$ and $(TbBi)_3(FeAlGa)_5O_{12}$.

Conventionally, the BIG is grown by the LPE method as follows: The following materials were introduced in a precious metal crucible: oxides such as ferric oxide and rare-earth oxides, and flux components including lead oxide, boron oxide and bismuth oxide, which are the compositions of a rare-earth iron garnet. The crucible was placed in the middle of the vertical furnace for liquid phase epitaxy and heated to about 1,000° C., thereby melting the materials into a melt for growing a BIG. The melt is then cooled to about 800° C. so as to maintain the rare-earth iron garnet compositions at super saturation.

Then, a non-magnetic garnet substrate is attached to a substrate holder and slowly lowered from the upper part of the LPE furnace until the non-magnetic garnet substrate comes into contact with the surface of the melt. The substrate is then rotated in contact with the melt so that a garnet single crystal is epitaxially grown on the undersurface of the substrate. After the garnet single crystal having a predetermined thickness has grown, the substrate is lifted about several centimeters above the surface of the melt and is spun at a high speed to spin-remove the most of the melt adhering to the substrate. Then, the substrate is taken out from the LPE furnace.

The thus obtained BIG is subjected to the polishing process to separate the substrate from the BIG. During the polishing process, the BIG is polished to a desired thickness. Then, anti-reflection films are formed on both sides of the crystal by vacuum vapor deposition. Finally, using a dicing machine or a scriber, the crystal film is cut into sizes in the range from a 1 mm square (1 mm×1 mm) to a 2 mm square (2 mm×2 mm), which are the sizes of Faraday rotator for optical isolators.

Semiconductor lasers have a variety of wavelengths. For long-distance optical fiber communications, wavelengths such as 1.31 $\mu$m and 1.55 $\mu$m (referred to "long wavelength regions") are used since they exhibit low loss in quartz optical fiber. For $(HoTbBi)_3Fe_5O_{12}$, the thickness of a Faraday rotator is about 250 $\mu$m at a wavelength of 1.33 $\mu$m and about 360 $\mu$m at a wavelength of 1.55 $\mu$m. The thickness decreases by about 50 $\mu$m while the crystal film is subjected to polishing process. Therefore, the BIG should be grown about 50 $\mu$m thicker than the final thickness. That is, the crystal film should be grown to a thickness of about 300 $\mu$m for a wavelength of 1.33 $\mu$m and a thickness of about 410 $\mu$m for a wavelength of 1.55 $\mu$m.

BIGs have larger coefficients of thermal expansion than non-magnetic garnet substrates to be used and it is therefore difficult to manufacture a BIG on a commercial basis, which BIG has a thickness large than 300 $\mu$m and no warp at room temperature.

In other words, the BIG is usually warped at room temperature. In the present invention, the direction of warp of a substrate is "positive" or "+" if the BIG with a substrate thereon is convex upward when it is held in a horizontal plane with the substrate side facing up. Although the lattice constants of the substrate and BIG are almost the same during the growth of crystal, the crystal film is warped at room temperature due to the fact that the BIG shrinks more than the substrate when the BIG with the substrate thereon is cooled down. The magnitude of warp depends on the thickness of the substrate. The larger the thickness of the substrate, the smaller the warp of the substrate. However, the substrate becomes more expensive with increasing thickness and requires a longer time when the BIG with the substrate is polished to remove the substrate. Thus, a thin substrate is desirable. A thin garnet substrate that is currently available is 400 $\mu$m for a 2-inch size and 500 $\mu$m for a 3-inch size.

When such a thin substrate is used on a commercial basis, it is desirable to maintain the warp of the BIG at room temperature in the range from +0.3 m$^{-1}$ to +0.7 m$^{-1}$, defined in terms of the reciprocal of a radius of curvature. The substrate is apt to crack during the crystal growth, if the conditions for growing the BIG are selected such that the radius of curvature is not larger than +0.3 m$^{-1}$ at room temperature, probably because there occurs a large mismatching in lattice constant between the substrate and the BIG during the crystal growth and therefore a negative component of the warp increases. Conversely, the conditions for growing the BIG may also be selected such that the radius of curvature is larger than +0.7 m$^{-1}$ at room temperature in which case, a mismatching in lattice constant between the substrate and the BIG during the crystal growth is small and therefore there is no chance of the substrate cracking. However, when the BIG is cooled down to room temperature, the warp becomes too large due to the difference in coefficient of thermal expansion, increasing the chance of the BIG cracking.

If a 2-inch BIG or a 3-inch BIG has a warp in the range from +0.3 m$^{-1}$ to +0.7 m$^{-1}$, the BIG cracks during polishing process. Thus, the BIG must be cut into sizes smaller than a 10 mm square before polishing process. Cutting a BIG into smaller sizes creates a problem that a large number of small BIGs must be handled during the polishing process and the subsequent antireflective coating process, and a problem that the yield of final chips is smaller since the BIGs of an intermediate size are further cut into final chip sizes for a Faraday rotator.

SUMMARY OF THE INVENTION

An object of the invention is to provide a method of manufacturing as flat a BIG film with the non-magnetic substrate thereon as possible.

Another object of the invention is to reduce the manufacturing cost and obtain as large a size of film to be polished as possible.

A method is used when manufacturing a bismuth-substituted rare-earth iron garnet single crystal film by a liquid phase epitaxial method. The bismuth-substituted rare-earth iron garnet single crystal film is grown on one side of a non-magnetic garnet substrate using a melt that contains flux components and rare-earth oxides. The method comprising the steps of adding an amount of a calcium compound to the melt, growing the film on a non-magnetic garnet substrate, and subjecting the film-substrate structure to the hydrogen reduction.

An amount of a calcium compound is added to the melt. The amount is such that a difference between optical absorption coefficients of the film at a wavelength of 0.78 $\mu$m before and after subjecting the film to hydrogen-reduction treatment is in the range of from 660 to 1430 dB/cm. The film is grown on a non-magnetic garnet substrate having a thickness in the range from 400 to 600 $\mu$m, the film being grown at a crystal growth temperature of the melt to form a film-substrate structure. The film-substrate structure has a curvature in the range from +0.3 to +0.7 $m^{-1}$ at room temperature. The curvature ($\rho$) has a sign of "+" if the film-substrate structure is upwardly convex when the film-substrate structure is held in a horizontal plane with a substrate side facing up, and a sign of "−" if the film-substrate structure is upwardly concave. The film-substrate structure is subjected to the hydrogen reduction at a temperature in the range from 320 to 400° C. in a hydrogen atmosphere so that the curvature ($\rho$) of the film-substrate structure decreases to a value in the range from −0.1 to +0.1 $m^{-1}$.

The bismuth-substituted rare-earth iron garnet single crystal film is one of $(HoTbBi)_3Fe_5O_{12}$, $(TbBi)_3(FeAlGa)_5O_{12}$, and $(YGdBi)_3(FeAlGa)_5O_{12}$, all of which being doped with calcium and having a thickness in the range from 250 to 550 $\mu$m.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
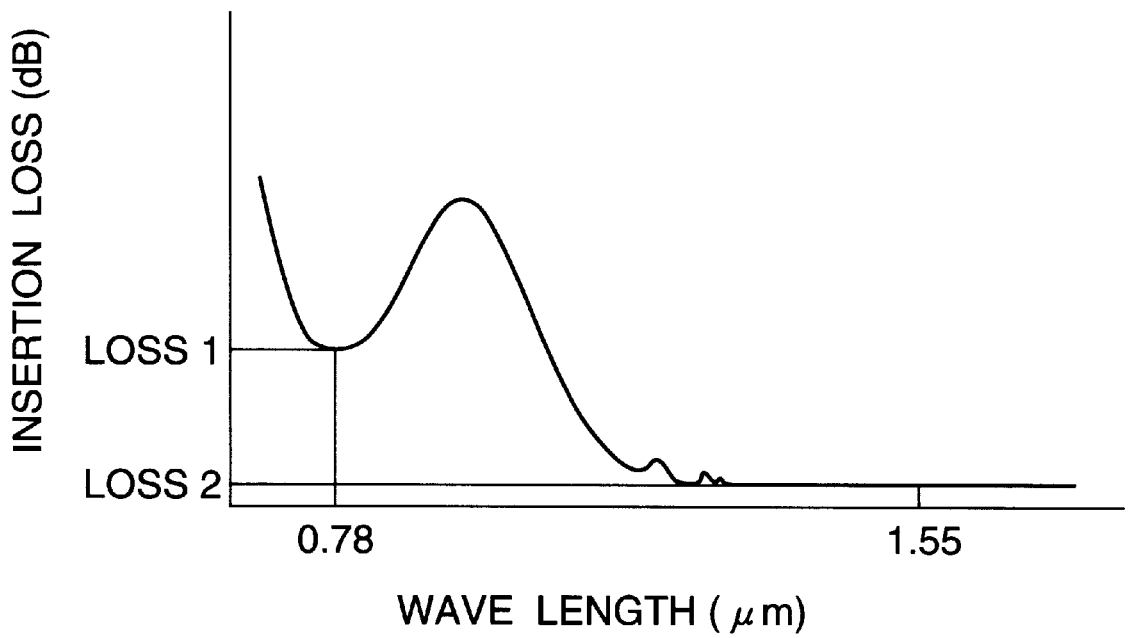
FIG. 1 illustrates optical loss spectrum of $(HoTbBi)_3Fe_5O_{12}$ measured with a spectrum analyzer.

In order to reduce the manufacturing cost, it is desirable to polish as large, flat a BIG film as possible. For this purpose, the inventors endeavored to establish a method of manufacturing as flat a BIG film with the non-magnetic substrate (referred to as "film-substrate structure" hereinafter) thereon as possible.

Thick film-substrate structures having an overall thickness in excess of 250 $\mu$m have positive curvatures. This is because the BIG film shrinks more than the non-magnetic substrate. Thus, if only the BIG film can be expanded, i.e., if the lattice constant of the BIG can be made larger, then the resulting film-substrate structure can be expected to be flatter.

One known way of reducing the light absorption loss of a BIG is to subject the BIG to reduction process. An article in "Journal Magnetic Society of Japan, Vol. 11, Supplement, No. S1, 1967, pp203–206" has reported on an example of reducing the BIG where 2.2 $\mu$m-thick and 5.7 $\mu$m-thick $(BiGd)_3(FeAlGa)_5O_{12}$ with the non-magnetic substrates thereon were doped with calcium and subsequently subjected to reduction process. It has also been reported that reduction results in a larger lattice constant of a rare-earth iron garnet single crystal film. The above-reported BIGs are very thin and therefore will not warp even though they are on a non-magnetic substrate. Therefore, reduction should be easily effected since they are thin films. However, for a Faraday rotator, a thicker BIG is needed.

The inventors of the present invention manufactured a film-substrate structure having an overall thickness larger than 250 $\mu$m, and investigated the structure in detail to determine the relationships among reduction process, changes in curvature due to the reduction, and performance as a Faraday rotator.

The investigation revealed that the thick BIG film doped with calcium can be reduced even though it is thick, and that the difference between optical absorption coefficients before and after reducing the thick BIG film is quantitatively related to the difference between curvatures before and after reducing the thick BIG film. The inventors continued to investigate and finally arrived at the present invention.

The present invention is directed to a method of manufacturing a bismuth-substituted rare-earth iron garnet single crystal film by the LPE method where a bismuth-substituted rare-earth iron garnet single crystal film is grown on one side of a non-magnetic garnet substrate using a melt that contains flux components and rare-earth oxides.

(1) A calcium compound is added to the melt such that when the bismuth-substituted rare-earth iron garnet single crystal films before and after subjecting to the hydrogen-reduction treatment are compared with each other, the difference in optical absorption coefficient at a wavelength of 0.78 $\mu$m is in the range of from 660 to 1430 dB/cm.

(2) A non-magnetic garnet substrate used in the invention has a thickness in the range from 400 to 600 $\mu$m.

(3) The crystal growth temperature is selected such that the film-substrate structure has a curvature $\rho$ in the range from +0.3 to +0.7 $m^{-1}$ at room temperature.

(4) The film-substrate structure manufactured at step (3) is subjected to heat treatment at a temperature in the range from 320 to 400° C. in a hydrogen atmosphere, thereby reducing the film-structure so that the curvature ρ of the film-substrate structure decreases to a value in the range from −0.1 to +0.1 m$^{-1}$.

A thick bismuth-substituted rare-earth iron garnet single crystal film of the present invention is preferably selected from (HoTbBi)$_3$Fe$_5$O$_{12}$, (TbBi)$_3$(FeAlGa)$_5$O$_{12}$, and (YGdBi)$_3$(FeAlGa)$_5$O$_{12}$, which are doped with calcium and have a thickness in the range from 250 to 550 μm.

The present invention will now be described in detail.

For the aforementioned reasons, in the present invention, a non-magnetic garnet substrate having a thickness in the range from 400 to 600 μm is used to grow a BIG single crystal. Such a substrate can be selected from any well-known substrates such as a non-magnetic garnet [(GdCa)$_3$(GaMgzr)$_5$O$_{12}$] having a lattice constant in the range from 1.2490 to 1.2515 nm, sold as an SGGG substrate.

Figure 3A:
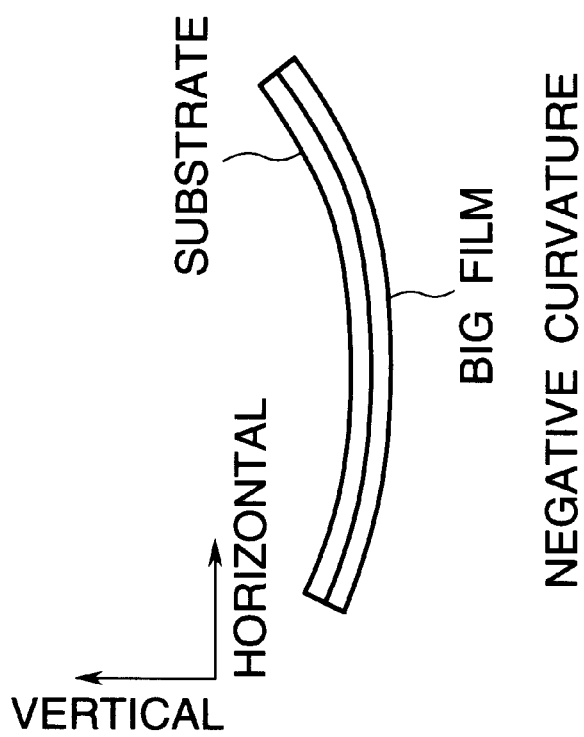
FIGS. 3A and 3B illustrate directions of curvature.
Figure 3B:
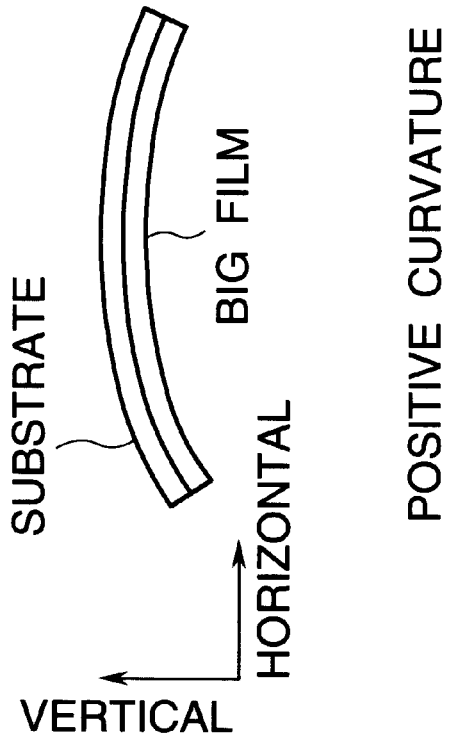

Then, a thick BIG film is grown on the non-magnetic garnet substrate, such that the film-substrate structure has a curvature in the range from +0.3 to +0.7 m$^{-1}$. Curvatures in this range are such that the conditions for crystal growth accommodate some difference in lattice constant during the crystal growth, and cracks at room temperature are difficult to occur. In this specification, the curvature ρ is "positive" or "+" if the film-substrate structure is convex upwardly when the film-substrate structure is held in a horizontal plane with the substrate side facing up, and "negative" or "−" if the film-substrate structure is convex downwardly. FIGS. 3A and 3B illustrate directions of curvature.

This film-substrate structure is directly subjected to heat treatment in a hydrogen atmosphere or is first cut into desired sizes and then subjected to heat treatment in a hydrogen atmosphere, so that the curvature ρ after heat treatment is substantially in the range from −0.1 to +0.1 m$^{-1}$, and more preferably 0.0 m$^{-1}$. In this manner, a film-substrate structure having a curvature in the range from −0.1 to +0.1 m$^{-1}$ can be manufactured. Therefore, BIGs of a 14 mm square or larger can still be polished without being cracked.

When the film-substrate structure, doped with calcium, is subjected to hydrogen reduction, the optical absorption coefficient and curvature ρ at a wavelength of 0.78 μm decrease.

The inventors found that the difference Δρ(m$^{-1}$) between the curvatures before and after reducing the film-substrate structure is related to the difference between the optical absorption coefficients Δα(dB/cm) at a wavelength of 0.78 μm before and after reducing the film-substrate structure. That is, Δρ and Δα are related by the following approximation equation (1):

$$\Delta\rho = 0.00052 \times \Delta\alpha - 0.043 \quad (1)$$

The reason why an optical absorption coefficient α at a wavelength of 0.78 μm is used will be described briefly.

FIG. 1 illustrates optical loss spectra of (HoTbBi)$_3$Fe$_5$O$_{12}$ measured with a spectrum analyzer. The loss (LOSS1) at a wavelength of 0.78 μm includes light absorption and Fresnel reflection. The Fresnel reflection is a loss due to the difference in refraction index and occurs at boundaries between the substrate and BIG, BIG and air, and substrate and air. Some scattering occurs but is negligibly little since the surface of the single crystal film is mirror-like.

The loss (LOSS2) at a wavelength of 1.55 μm also includes losses due to light absorption and Fresnel reflection. However, the light absorption is small and therefore most of the loss at 1.55 μm is due to Fresnel reflection. The refraction index at the boundary between the substrate and the BIG is not more than 5% at wavelengths of 0.78 μm and 1.55 μm and therefore it can be assumed that the Fresnel reflections at 0.78 μm and 1.55 μm are much the same. Therefore, the light absorption at a wavelength of 0.78 μm is given by the difference between the LOSS1 and LOSS2. The optical absorption coefficient α has a reasonably large value at a wavelength of 0.78 μm and thus measurement of loss can be made easily. This is the reason why the optical absorption coefficient at 0.78 μm is used in Equation (1).

As is clear from Equation (1), if an appropriate amount of calcium is added to the melt so that the difference in optical absorption coefficient Δα is 1044 dB/cm, a BIG having a curvature of 0.0 m$^{-1}$ can be manufactured by using a film-substrate structure having a curvature of +0.5 m$^{-1}$. Subjecting the film-substrate structure having a curvature of +0.5 m$^{-1}$ to heat treatment in a hydrogen atmosphere sufficiently longer than a minimum required length of time will yield a BIG having a curvature of 0.0 m$^{-1}$. The film-substrate structure may have a curvature of, for example, +0.3 m$^{-1}$ after crystal growth due to variations of manufacturing conditions. Such a film-substrate structure is subjected to heat treatment in a hydrogen atmosphere for a shorter time than the duration required for the film-substrate structure having a curvature of +0.5 m$^{-1}$, thereby making the film-substrate structure flat. Then, after polishing the film-substrate structure to remove the non-magnetic garnet substrate therefrom, the BIG is again subjected to heat treatment in a hydrogen atmosphere to further reduce its optical absorption coefficient.

Although any material that contains calcium may be used to add calcium to the melt, CaO or CaCO3 is preferred since they are easy to handle.

A preferred amount of calcium to be added to the melt is more than 0.03, and more preferably 0.1 to 0.5, in terms of atomic ratio (Ca/R) of calcium to rare-earth elements (R). If an atomic ratio x is less than 0.03, too small an amount of calcium is added to the melt, seriously retarding the reduction. If an atomic ratio x is large, an increased amount of calcium is added to the melt, and correspondingly less bismuth enters the BIG with the result that the Faraday rotation coefficient decreases. Thus, the value of x should be determined taking the desired properties of BIG into account. If no other bivalent element is available, the value of x may be less than 0.2 and a large value of x does not improve the result.

A BIG is heat-treated in a hydrogen atmosphere at a temperature in the range from 320 to 440° C., and more preferably from 330 to 380° C. If the heat treatment is performed at temperatures lower than 320° C., the heat treatment needs to carried out longer in order for the light absorption loss to decrease. Conversely, temperatures higher than 400° C. are not desirable since such high temperatures cause a portion of bismuth component in the BIG to become metalized, increasing light absorption loss.

EXAMPLES

The present invention will now be described by way of specific examples.

Example 1

The following materials were placed in a platinum crucible of 3,000 ml capacity: 6,000 gm lead oxide (PbO, 4N), 6,960 gm bismuth oxide (Bi$_2$O$_3$, 4N), 918 gm ferric oxide (Fe$_2$O$_3$, 4N), 252 gm boronoxide (B$_2$O$_3$, 5N), 41.0 gm terbium oxide (Tb$_2$O$_3$, 3N), 54.0 gm holmium oxide ($Ho_2O_3$, 3N), and 2.9 gm calcium oxide (CaO, 3N). The atomic ratio x of calcium to the rare-earth elements is 0.1. The crucible was placed in the center of the vertical electric furnace and heated to about 1,000° C. and sufficiently blended into a melt, which is subsequently used for growing a bismuth-substituted rare-earth iron garnet single crystal.

The melt was then cooled to a temperature below a saturation temperature. Subsequently, by the usual method, a 3-inch (111) garnet single crystal [$(GdCa)_3(GaMgZr)_5O_{12}$] substrate having a lattice constant of 1.2497±0.0002 nm and a thickness of 500 μm was lowered until one side thereof comes into contact with the surface of the melt. Then, epitaxial growth was performed with the substrate rotating in contact with the melt. In this manner, a $(HoTbBi)_3Fe_5O_{12}$ (referred to as "BIG-1" hereinafter) having a thickness 393 μm was manufactured.

Residual melt adhering to BIG-1 was dissolved and removed from BIG-1 using an aqueous solution of hydrochloric acid. Then, measurements were made to determine curvature, optical absorption coefficient at a wavelength of 0.78 μm, and Faraday rotation angle. BIG-1 had a curvature of +0.32 m$^{-1}$, optical absorption coefficient of 1,010 dB/cm at a wavelength of 0.78 μm, and a Faraday rotation angle of 48.7° at a wavelength of 1.55 μm.

BIG-1 was cut by a dicing machine with a 0.2 mm-thick blade into 16 sub-divided pieces of a 14-mm square.

Five arbitrary pieces were selected from the 16 pieces, and subjected to heat treatment for five hours at 350° C. in a hydrogen atmosphere. The average resulting curvature and optical absorption coefficient were +0.06 m$^{-1}$ and 450 dB/cm, respectively. BIG-1 was magnetically saturated when the optical absorption coefficient was being measured. This prevents a problem that a magnetically non-saturated BIG exhibits diffraction due to the multidomain structure of the BIG and the diffraction causes errors in the measurement of optical absorption coefficient.

Then, the five sub-divided pieces were polished. The substrate side was first polished to separate the BIG from the substrate and then the BIG was polished on its surface side to a thickness of 362 μm. All of the five pieces could be successfully polished without cracking.

An antireflection film for a wavelength of 1.55 μm was applied to both sides of each of the five polished BIG-1. Two arbitrary pieces out of the five pieces were cut into a total of 128 chips of a 1.6 mm square by using the dicing machine having a 0.05 mm-thick blade.

Twenty arbitrary chips were selected from 128 chips and measurements were made to determine insertion loss, Faraday rotation angle, and extinction ratio using a semiconductor laser having a wavelength of 1.55 μm.

The insertion loss was in the range from 0.04 to 0.08 dB with an average of 0.06 dB. Average values of the Faraday rotation angle and the extinction ratio were, 45.7° and 44 dB, respectively, which are satisfactory for a Faraday rotator.

Example 2

The following materials were placed in a platinum crucible of 3,000 ml capacity: 6,000 gm lead oxide (PbO, 4N), 6,960 gm bismuth oxide ($Bi_2O_3$, 4N), 918 gm ferric oxide ($Fe_2O_3$, 4N), 252 gm boron oxide ($B_2O_3$, 5N), 41.0 gm terbium oxide ($Tb_2O_3$, 3N), 54.0 gm holmium oxide ($Ho_2O_3$, 3N), and 5.8 gm calcium oxide (CaO, 3N). The atomic ratio x of calcium to the rare-earth elements is 0.2. The crucible was placed in the center of the vertical electric furnace and heated to about 1,000° C. and sufficiently blended into a melt, which is subsequently used for growing a bismuth-substituted rare-earth iron garnet single crystal.

The melt was then cooled to a temperature below the saturation temperature. Subsequently, by the usual method, a 3-inch (111) garnet single crystal [$(GdCa)_3(GaMgZr)_5O_{12}$] substrate having a lattice constant of 1.2497±0.0002 nm and a thickness of 500 μm was lowered until one side thereof comes into contact with the surface of the melt. Then, epitaxial growth was performed with the substrate rotating. In this manner, a $(HoTbBi)_3Fe_5O_{12}$ (referred to as "BIG-2") having a thickness 327 μm was manufactured. Residual melt adhering to BIG-2 is dissolved and removed using an aqueous solution of hydrochloric acid. Then, measurements were made to determine a curvature, an optical absorption coefficient at a wavelength of 0.78 μm, and a Faraday rotation angle. The BIG-2 had a curvature of +0.58 m$^{-1}$ and a Faraday rotation angle of 52.2° at a wavelength of 1.31 μm. The loss at a wavelength of 0.78 μm was too large to measure the optical absorption coefficient. Thus, crystal growth was performed again under the same temperature conditions to manufacture a $(HoTbBi)_3Fe_5O_{12}$ having a thickness of 127 μm. The optical absorption coefficient of this film-substrate structure was 1620 dB/cm. Thus, it was assumed that the optical absorption coefficient of BIG-2 is 1,620 dB/cm.

BIG-2 was cut into 16 sub-divided pieces of a 14-mm square.

The 16 pieces were subjected to heat treatment for ten hours at 340° C. in a hydrogen atmosphere. The curvature of the BIG-2 was −0.01 m$^{-1}$ and the optical absorption coefficient was 464 dB/cm. The sub-divided pieces were then polished. The sub-divided piece was polished first on the substrate side to separate the substrate from the film-substrate structure, and then on the BIG surface side, thereby achieving a final thickness of 248 μm. All of the sub-divided pieces were successfully polished without cracking.

An antireflection film for a wavelength of 1.31 μm was applied to both sides of each of the polished BIG-2. Two arbitrary pieces out of 16 pieces were cut into a total of 128 chips of a 1.6 mm square.

Twenty arbitrary chips were selected from the 128 chips and measurements were made to determine insertion loss, Faraday rotation angle, and extinction ratio using a semiconductor laser having a wavelength of 1.31 μm.

The insertion loss was in the range from 0.03 to 0.05 dB and an average value was 0.04 dB. Average Faraday rotation angle and the extinction ratio were 45.5° and 45 dB, respectively, which are satisfactory for a Faraday rotator.

Example 3

The following materials were placed in a platinum crucible of 2,000 ml capacity: 3,546 gm lead oxide (PbO, 4N), 3,733 gm bismuth oxide ($Bi_2O_3$, 4N), 448 gm ferric oxide ($Fe_2O_3$, 4N), 165 gm boron oxide ($B_2O_3$, 5N), 45.9 gm terbium oxide ($Tb_2O_3$, 3N), 13.9 gm aluminum oxide ($Al_2O_3$, 3N), 42.7 gm gallium oxide ($Ga_2O_3$, 3N), and 6.25 gm calcium carbonate ($CaCO_3$, 3N). The atomic ratio x of calcium to the rare-earth elements is 0.25. The crucible was placed in the center of the vertical electric furnace and heated to about 1,000° C. and sufficiently blended into a melt for growing a bismuth-substituted rare-earth iron garnet single crystal.

The melt was then cooled to a temperature below the saturation temperature. Subsequently, by the usual method, a 2-inch (111) garnet single crystal [$(GdCa)_3(GaMgZr)_5O_{12}$] substrate having a lattice constant of 1.2497±0.0002 nm and a thickness of 500 μm was lowered until one side thereof comes into contact with the surface of the melt. Then, epitaxial growth was carried out with the substrate rotating. In this manner, a $(TbBi)_3(FeAlGa)_5O_{12}$ (referred to as "BIG-3") having a thickness of 356 μm was manufactured.

Residual melt adhering to BIG-3 was dissolved and removed from BIG-3 using an aqueous solution of hydrochloric acid. Then, measurements were made to determine curvature, optical absorption coefficient, and a Faraday rotation angle. The BIG-3 had a curvature of +0.60 m$^{-1}$ and a Faraday rotation angle of 51.5° at a wavelength of 1.31 μm. The loss was too large to measure the optical absorption coefficient at a wavelength of 0.78 μm. Thus, crystal growth was performed again under the same temperature conditions to manufacture a $(TbBi)_3(FeAlGa)_5O_{12}$ having a thickness of 147 μm. The optical absorption coefficient of this BIG was 1600 dB/cm. Thus, it was assumed that the optical absorption coefficient of BIG-3 is 1,600 dB/cm.

Figure 2:
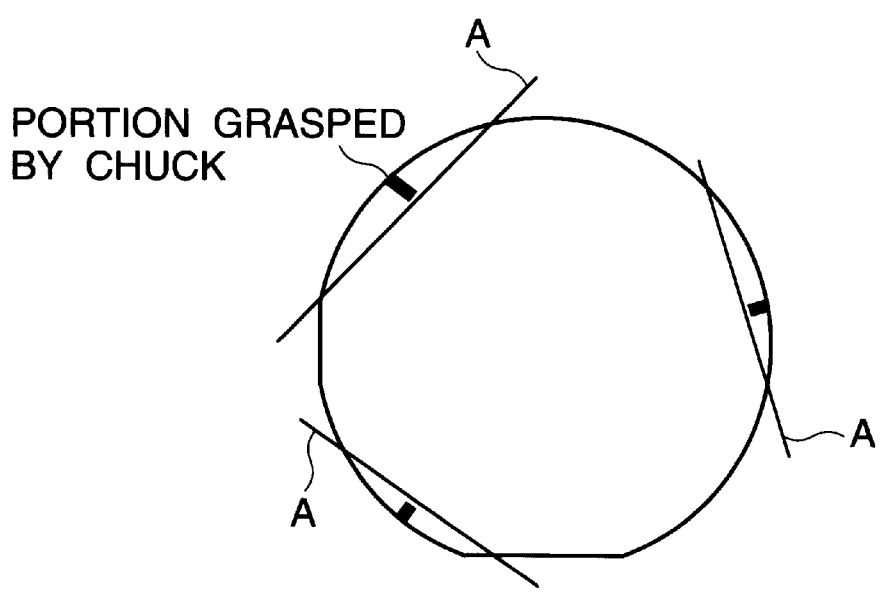
FIG. 2 shows three portions grasped by the chuck of the substrate holder during the crystal growth.

FIG. 2 shows three portions of the film-substrate structure, grasped by the chucks of the substrate holder during the crystal growth. The film-substrate structure (BIG-3) was cut at the three portions along lines A. Then, the BIG-3 having no chuck marks was subjected to heat treatment for five hours at 350° C. in a hydrogen atmosphere. The curvature of BIG-3 was −0.02 m$^{-1}$ and the optical absorption coefficient was 375 dB/cm.

The BIG-3 having a curvature of −0.02 m$^{-1}$ was polished to a thickness of 310 μm. No crack occurred during the polishing.

An antireflection film for a wavelength of 1.31 μm was applied to both sides of each of polished BIG-3. Then, BIG-3 was cut into four pieces and one of the four pieces was further cut into 150 chips of a 1.6 mm square.

Twenty arbitrary chips were selected from the 150 chips and measurements were made to determine insertion loss, Faraday rotation angle, and extinction ratio using a semiconductor laser having a wavelength of 1.31 μm. The insertion loss was in the range from 0.03 to 0.05 dB with an average of 0.04 dB. The average Faraday rotation angle was 45.1 and the average extinction ratio was 45 dB which are satisfactory for a Faraday rotator.

Comparison 1

A $(HoTbBi)_3Fe_5O_{12}$ (referred to as BIG-C1 hereinafter) having a thickness of 417 μm was manufactured using the same melt as the Example 1 except that calcium oxide (CaO) was not used. The other manufacturing conditions were the same as Example 1.

Residual melt adhering to BIG-C1 was dissolved and removed using an aqueous solution of hydrochloric acid and then measurements were made to determine curvature and Faraday rotation angle. The BIG-C1 had a curvature of +0.44 m$^{-1}$, optical absorption coefficient of 588 dB/cm at a wavelength of 1.55 μm, and a Faraday rotation angle of 50.1° at a wavelength of 1.55 μm.

BIG-C1 was cut into 16 sub-divided pieces of a 14 mm square.

All of the 16 sub-divided pieces were subjected to heat treatment for 15 hours at 380° C. in a hydrogen atmosphere. The average resulting curvature and optical absorption coefficient were +0.42 m$^{-1}$ and 472 dB/cm, respectively. After, the heat treatment, arbitrary one of the 16 sub-divided pieces was polished before cutting into smaller sizes, just as in the Example 1. During the polishing, the sub-divided piece was broken into 17 fragments of random shapes.

Arbitrary two fragments were selected from the 17 fragments and further polished to a thickness of 355 μm. Then, an antireflective film for a wavelength of 1.55 μm was applied to both sides of each fragment. Then, the fragments were cut into a total of 68 chips of a 1.6 mm square.

Arbitrary 20 chips were selected from the 68 chips and measurements were made to determine insertion loss. The insertion loss was in the range from 0.05 to 1.6 dB with an average of 0.34 dB.

Comparison 2

Five sub-divided pieces of BIG-1 of a 14-mm square manufactured in Example 1, which have not been subjected to heat treatment in a hydrogen atmosphere, were subjected to heat treatment for 24 hours at 310° C. in a hydrogen atmosphere. The average resulting curvature was +0.45 m$^{-1}$ and the average optical absorption coefficient was 985 dB/cm. This BIG-1 is referred to as BIG-C2. When one of BIG-C2 was attached to the chuck of the polishing machine, BIG-C2 was broken into five fragments.

Comparison 3

Five sub-divided pieces of BIG-1 of a 14-mm square manufactured in Example 1, which have not been subjected to heat treatment in a hydrogen atmosphere, were subjected to heat treatment for three hours at 420° C. in a hydrogen atmosphere. The average resulting curvature was −0.27 m$^{-1}$ and the average optical absorption coefficient was 964 dB/cm. All of the five sub-divided pieces of BIG-1 had metallic gloss. X-ray fluorescence analysis showed that the metallic gloss was due to metallized bismuth.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method of manufacturing a bismuth-substituted rare-earth iron garnet single crystal film by a liquid phase epitaxial method where the bismuth-substituted rare-earth iron garnet single crystal film is grown on one side of a non-magnetic garnet substrate using a melt that contains flux components and rare-earth oxides, the method comprising the steps of:

adding an amount of a calcium compound to the melt, the amount being such that a difference between optical absorption coefficients of a film-substrate structure at a wavelength of 0.78 μm before and after subjecting the film-substrate structure to hydrogen-reduction treatment is in the range of from 660 to 1430 dB/cm;

maintaining the melt at a predetermined crystal growth temperature;

growing the bismuth-substituted rare-earth iron garnet single crystal film on a non-magnetic garnet substrate having a thickness in the range from 400 to 600 μm, the bismuth-substituted rare-earth iron garnet single crystal film being grown at a crystal growth temperature of the melt to form the film-substrate structure; and subjecting the film-substrate structure to hydrogen reduction at a temperature in the range from 320 to 400° C. in a hydrogen atmosphere.

2. The method according to claim 1, wherein the predetermined crystal growth temperature is such that the film-substrate structure has a curvature in the range from +0.3 to +0.7 m$^{-1}$ at room temperature before the film-substrate structure is subjected to the hydrogen reduction, the curvature having a sign of "+" if the film-substrate structure is convex upwardly when the film-substrate structure is held in a horizontal plane with a substrate side facing up, and a sign of "−" if the film-substrate structure is convex downwardly.

3. The method according to claim 2, wherein the curvature decreases to a value in the range from −0.1 to +0.1 m$^{-1}$ after the film-substrate structure has been subjected to the hydrogen reduction.

4. The method according to claim 1, wherein the bismuth-substituted rare-earth iron garnet single crystal film is one of $(HoTbBi)_3Fe_5O_{12}$, $(TbBi)_3(FeAlGa)_5O_{12}$, and $(YGdBi)_3(FeAlGa)_5O_{12}$, all of which being doped with calcium and having a thickness in the range from 250 to 550 $\mu$m.

\* \* \* \* \*